(12) United States Patent
Hombo

(10) Patent No.: US 9,755,342 B2
(45) Date of Patent: Sep. 5, 2017

(54) ELECTRONIC APPARATUS

(71) Applicant: CANON KABUSHIKI KAISHA, Tokyo (JP)

(72) Inventor: Tsunao Hombo, Toride (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/254,913

(22) Filed: Sep. 1, 2016

(65) Prior Publication Data
US 2017/0069991 A1 Mar. 9, 2017

(30) Foreign Application Priority Data

Sep. 8, 2015 (JP) .................................. 2015-176857

(51) Int. Cl.
*H01R 12/79* (2011.01)
*H05K 1/14* (2006.01)

(52) U.S. Cl.
CPC ............. *H01R 12/79* (2013.01); *H05K 1/148* (2013.01)

(58) Field of Classification Search
CPC ................................ H05K 1/148; H01R 12/79
See application file for complete search history.

(56) References Cited

U.S. PATENT DOCUMENTS

| | | | | |
|---|---|---|---|---|
| 5,356,308 A * | 10/1994 | Toba | ................... | H01R 13/5219 439/422 |
| 6,024,596 A * | 2/2000 | Tanaka | ................... | H01R 4/029 439/492 |
| 6,392,148 B1 * | 5/2002 | Ueno | ................... | B60R 16/0215 174/117 F |
| 6,969,807 B1 * | 11/2005 | Lin | ................... | H01B 7/0861 174/117 F |
| 7,189,926 B2 * | 3/2007 | Hung | ................... | H05K 1/118 174/117 F |
| 8,801,457 B2 * | 8/2014 | Nomura | ............... | H01R 12/613 439/492 |
| 2006/0286848 A1 * | 12/2006 | Kumakura | ............. | H01R 12/68 439/422 |
| 2007/0037440 A1 * | 2/2007 | Uchida | ................... | H01R 12/79 439/495 |
| 2008/0236868 A1 * | 10/2008 | Koga | ................... | H01B 7/0861 174/117 F |
| 2013/0012069 A1 * | 1/2013 | Liu | ................... | H01R 13/6315 439/626 |
| 2014/0004736 A1 * | 1/2014 | Chen | ................... | H01R 12/77 439/493 |
| 2015/0214644 A1 * | 7/2015 | Chang | ................... | H01R 12/594 439/498 |

FOREIGN PATENT DOCUMENTS

JP 2012170738 A 9/2012

* cited by examiner

*Primary Examiner* — Briggitte R Hammond
(74) *Attorney, Agent, or Firm* — Canon U.S.A., Inc. IP Division

(57) ABSTRACT

In a cable connecting a plurality of printed-circuit boards, terminals of connectors to which conductors disposed adjacent to conductors that supply power are connected are connected to ground via respective capacitors.

6 Claims, 5 Drawing Sheets

ELECTRONIC APPARATUS

BACKGROUND OF THE INVENTION

Field of the Invention

The present invention relates to an electronic apparatus including a first printed-circuit board, a second printed-circuit board, and a cable connected to the first and second printed-circuit, boards.

Description of the Related Art

In recent years, flexible flat cables (FFCs) have been frequently used for connecting a plurality of printed-circuit boards included in electronic apparatuses because of low cost. Furthermore, as the apparatuses become multifunctional and faster, the number of data transmission lines and the number of control signal lines increase, whereas the demand is increasing for reductions in the sizes of the apparatuses. Thus, while the number of conductors in FFCs also increases, some FFCs in which a space between pins is narrow are employed to achieve space-saving wiring.

In cases where relatively less power is consumed in a printed-circuit board, which is a connection destination, some FFCs are used for supplying power in addition to data signals and control signals.

In such a case, typically, to reduce impedance and noise in a conductor that supplies power, a conductor connected to ground is sometimes provided adjacent to the conductor that supplies power. The conductor connected to ground is connected to a terminal connected to ground in a printed-circuit board to which an FFC is connected.

An FFC includes evenly spaced thin-film conductors that are sandwiched between thin insulators. The FFC is inserted into a slit opening of a connector provided on a printed-circuit board and thus is connected to the connector. At this time, the FFC may be inserted into the connector at an angle. In this case, in the case where a conductor adjacent to a conductor that supplies power is connected to ground, a short circuit may occur between a power supply and ground and, as a result, cause a malfunction in an apparatus.

Japanese Patent Laid-Open No. 2012-170738 discloses, as illustrated in FIG. 5, a connector 72 which includes a plurality of terminals 75a to 75j including power supply terminals and a ground terminal, and a connector connection portion 84 which is formed at an end of an FFC 71 and in which inner conductors 82a to 82j whose coverings have been stripped are exposed. The connector connection portion 84 of the FFC 71 is inserted into the connector 72 and thus the FFC 71 is connected to the connector 72. Among the plurality of terminals 75a to 75j, terminals 75e, 75g, and 75i respectively disposed adjacent to power supply terminals 75f and 75h and a ground terminal 75j serve as idle terminals. In the connector connection portion 84, conductors 82e, 82g, and 82i corresponding to these idle terminals remain covered, and conductors corresponding to the other terminals are exposed. In the case of the FFC 71 illustrated in FIG. 5, a process of causing the conductors of the FFC 71 corresponding to the idle terminals to remain covered has to be performed, thereby causing an increase in cost.

SUMMARY OF THE INVENTION

The present invention has been made to keep a malfunction from occurring in an apparatus even if a short circuit occurs between a power supply and ground due to the angled insertion of a cable into a connector.

An aspect of the present invention provides an electronic apparatus. The electronic apparatus includes: a first printed-circuit board including a first connector having a first terminal, a second terminal, a third terminal and a fourth terminal; a second printed--circuit board including a second connector having a fifth terminal, a sixth terminal, a seventh terminal and an eighth terminal; and a cable having a plurality of conductors including a first conductor, a second conductor, a third conductor, and a fourth conductor, and the cable being connected to the first connector and the second connector. The first conductor is a line configured to transmit a signal and is connected to the first terminal of the first connector and the fifth terminal of the second connector. The third conductor is a line configured to supply power and is connected to the third terminal of the first connector and the seventh terminal of the second connector. The second conductor is a line configured to be connected to ground and is connected to the second terminal of the first connector and the sixth terminal of the second connector. The fourth conductor is a line configured to be connected to ground and is connected to the fourth terminal of the first connector and the eighth terminal of the second connector. In the cable, the second conductor and the fourth conductor are disposed adjacent to a conductor configured to supply power. In the first printed-circuit board, the second terminal and the fourth terminal are each connected to ground via a plurality of capacitors whose frequency responses are different. In the second printed-circuit board, the sixth terminal and the eighth terminal are each connected to ground via a plurality of capacitors whose frequency responses are different.

Further features of the present invention will become apparent from the following description of exemplary embodiments with reference to the attached drawings.

DESCRIPTION OF THE EMBODIMENTS

Figure 1:
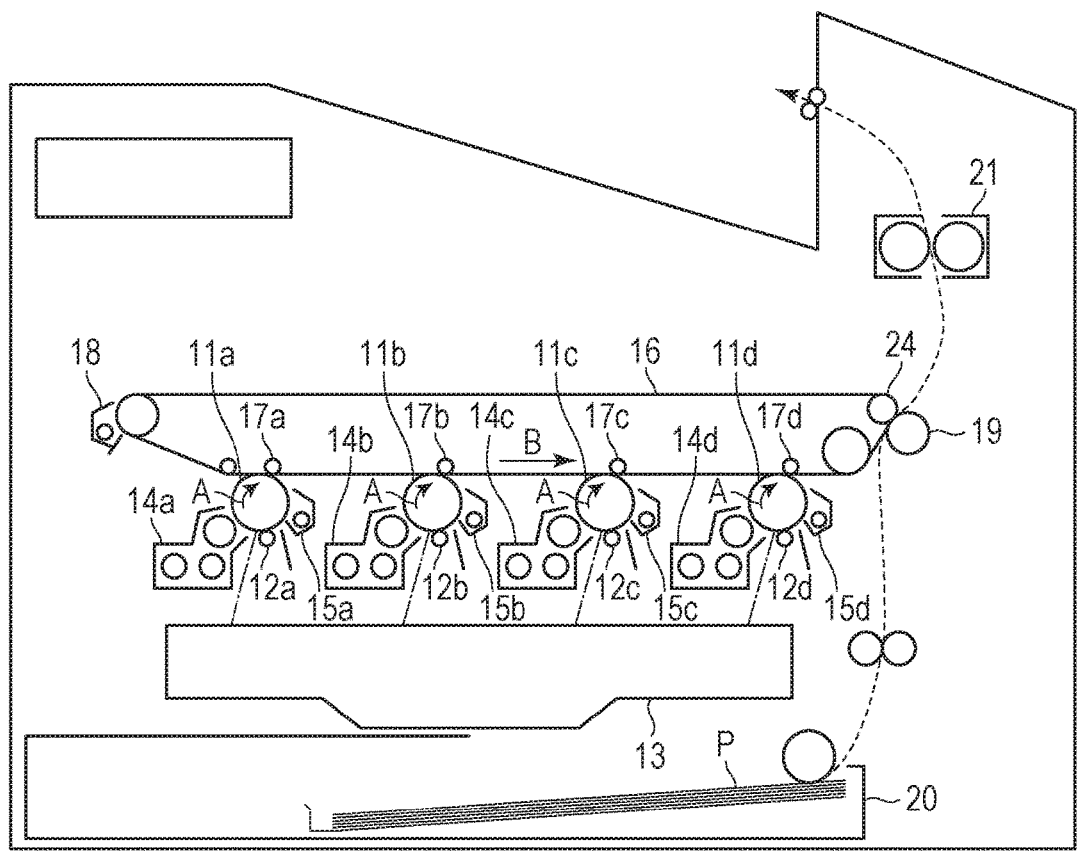
FIG. 1 is a configuration diagram of an image forming apparatus according to an embodiment.

The entire configuration of an image forming apparatus according to an embodiment will be described with reference to FIG. 1.

The image forming apparatus includes photosensitive drums 11a to 11d, primary charging units 12a to 12d, an exposure unit 13, development units 14a to 14d, primary transfer units 17a to 17d, cleaners 15a to 15d, an intermediate transfer belt 16, an intermediate transfer belt cleaner 18, a secondary transfer unit 19, and a paper cassette 20.

The respective photosensitive drums of yellow (11a), magenta (11b), cyan (11c), and black (11d) are arranged in a line in a sub-scanning direction of the intermediate transfer belt 16 stretched around a plurality of rollers including a secondary transfer opposite roller 24. The photosensitive drums 11a to 11d of the respective colors are uniformly charged by the primary charging units 12a to 12d and then are exposed to light by the exposure unit 13 in accordance with image signals, and thus electrostatic latent images are formed on the photosensitive drums 11a to 11d.

Figure 2:
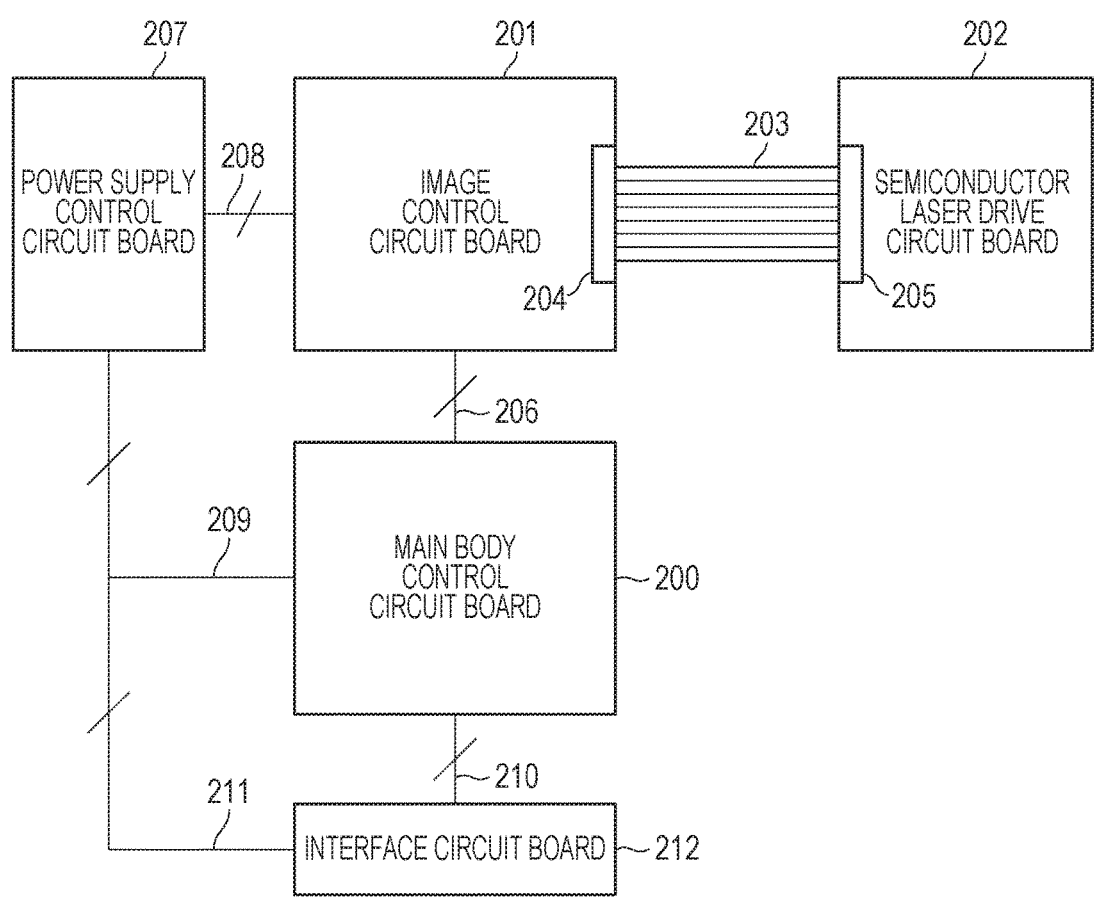
FIG. 2 illustrates the configuration of a plurality of printed-circuit boards for controlling an exposure unit.

Subsequently, the electrostatic latent images are developed into toner images by the development units 14a to 14d. Then, the toner images are transferred onto the intermediate transfer belt 16 in a superimposed manner by the primary transfer units 17a to 17d. The toner images are further transferred onto a recording material P conveyed from the paper cassette 20 by the secondary transfer unit 19. The toner images transferred onto the recording material P are fixed to the recording material P by a fixing unit 21. FIG. 2 illustrates the configuration of a electronic apparatus including a plurality of printed-circuit boards for controlling the exposure unit 13. The electronic apparatus is disposed substantially on the back of the image forming apparatus illustrated in FIG. 1.

An interface circuit board 212 receives image data from an external network (not illustrated). A main body control circuit board 200 is connected to the interface circuit board 212 via a harness 210. The main body control circuit board 200 receives image data from the interface circuit board 212 via the harness 210 and accumulates the image data. A power supply control circuit board 207 receives power from a commercial power supply (not illustrated) outside the image forming apparatus and converts the power into predetermined direct-current power to supply it to an image control circuit board 201, the main body control circuit board 200, and the interface circuit board 212 via harnesses 208, 209, and 211. The image control circuit board 201 is connected to the main body control circuit board 200 via a harness 206 and is connected to the power supply control circuit board 207 via the harness 208. The image control circuit board 201 receives image data accumulated in the main body control circuit board 200 via the harness 206 and converts the image data into a semiconductor laser drive signal. The image control circuit board 201 also generates an enable signal and a synchronization signal that are used for controlling a semiconductor laser.

The image control circuit board 201 outputs, to a semiconductor laser drive circuit board 202, via an FFC 203, a semiconductor laser drive signal, an enable signal, a synchronization signal, and direct-current power supplied from the power supply control circuit board 207. A conductor-to-conductor pitch of the FFC 203 according to the embodiment is less than 1.0 mm.

The semiconductor laser drive circuit board 202 drives a laser provided in the exposure unit 13 in accordance with a semiconductor laser drive signal.

One end of the FFC 203 is connected to a connector 204 provided on the image control circuit board 201, and the other end of the FFC 203 is connected to a connector 205 provided on the semiconductor laser drive circuit board 202.

Figure 3:
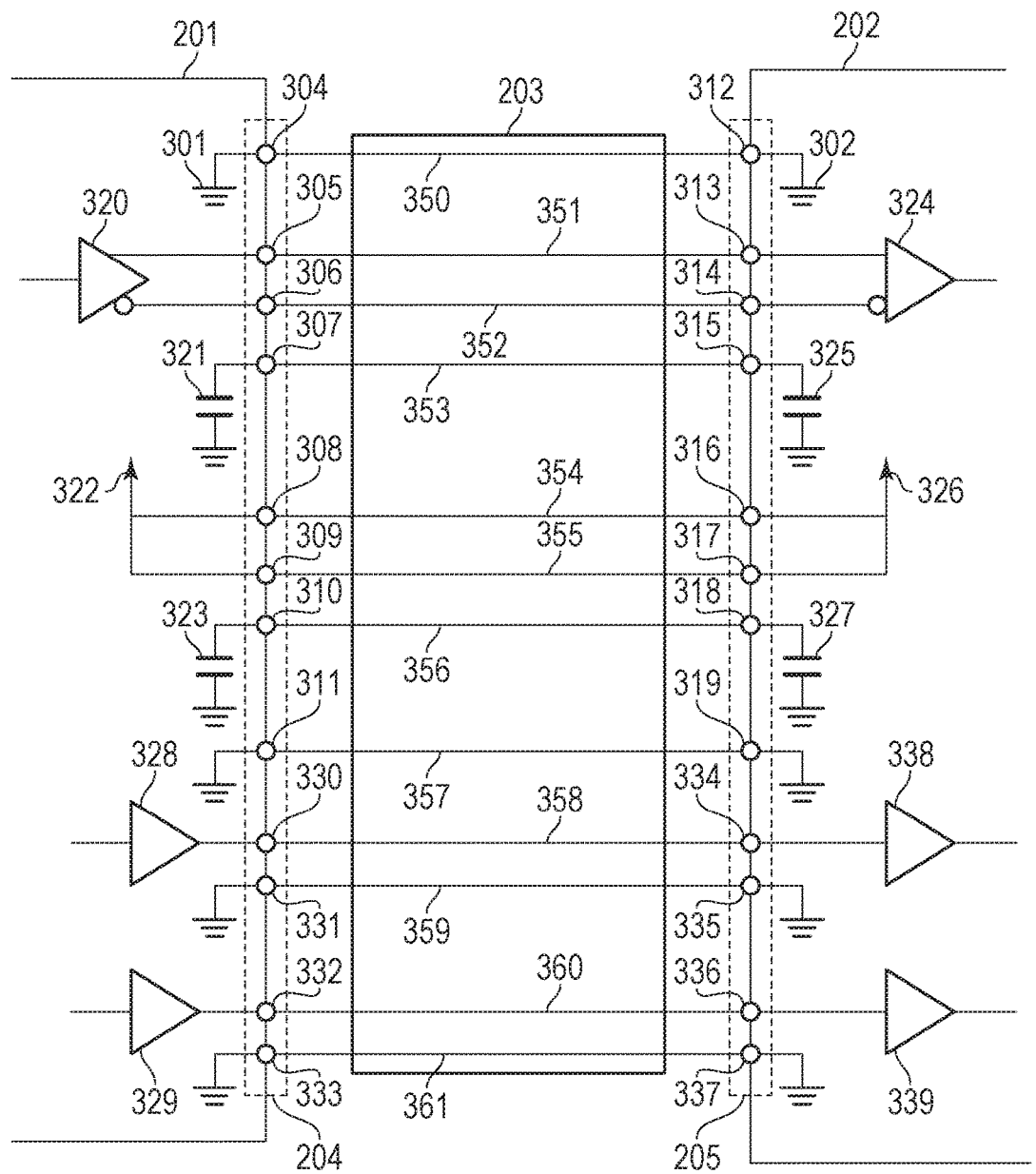
FIG. 3 illustrates pin configurations of connectors to which an FFC is connected.

FIG. 3 illustrates pin configurations of the connectors 204 and 205 to which the FFC 203 is connected.

The FFC 203 is a flexible flat cable including twelve conductors, that is, conductors 350 to 361. The connector 204 provided on the image control circuit board 201 includes terminals 304, 305, 306, 307, 308, 309, 310, 311, 330, 331, 332, and 333. These terminals are connected to ends of their respective corresponding conductors. The connector 205 mounted on the semiconductor laser drive circuit board 202 includes terminals 312, 313, 314, 315, 316, 317, 318, 319, 334, 335, 336, and 337. These terminals are connected to the other ends of the respective corresponding conductors. Thus, the terminals of the connector 204 and the terminals of the connector 205 are connected to each other via the conductors of the FFC 203.

Predetermined direct-current power supplied from the power supply control circuit board 207 is supplied to a power supply line 326 via a power supply line 322, the terminals 308 and 309 of the connector 204, the conductors 354 and 355, and the terminals 316 and 317.

In the FFC 203, the conductors 353 and 356 are provided adjacent to the conductors 354 and 355. The conductor 353 is connected to the terminal 307 and the terminal 315, and the conductor 356 is connected to the terminal 310 and the terminal 318. In the image control circuit board 201, the terminals 307 and 310 are connected to ground via capacitors 321 and 323, respectively. Then, in the semiconductor laser drive circuit board 202, the terminals 315 and 318 are connected to around via capacitors 325 and 327, respectively.

The conductors 353 and 356 adjacent to the conductors 354 and 355 that supply power are connected to ground via the capacitors. Thus, for example, even if the terminal 308 and the terminal 307 are shorted by inserting the FFC 203 into the connector 204 of the image control circuit board 201 at an angle, a malfunction can be kept from occurring in the image control circuit board 201 or the semiconductor laser drive circuit board 202 because of high impedance in terms of direct-current.

A semiconductor laser drive signal generated from image data in the image control circuit board 201 is input to an output buffer 320. A semiconductor laser drive signal is a square-wave signal containing high-frequency components. Thus, the semiconductor laser drive signal is converted into low-amplitude differential signals (for example, low-voltage differential signaling (LVDS)) by using the output buffer 320.

The low-amplitude differential signals output from the output buffer 320 are input to a receiving buffer 324 via the terminals 305 and 306 of the connector 204, the conductors 351 and 352, and the terminals 313 and 314 and are restored to the semiconductor laser drive signal.

In the case where low-amplitude differential signals are transmitted by using the FCC 203, in terms of characteristic impedance matching and the provision of a return signal path, it is desirable that the terminals 304 and 307 and the terminals 312 and 315 to which the conductors 350 and 353 adjacent to the conductors 351 and 352 are connected have low impedance in terms of high frequency.

The terminal 304 of the connector 204 on the image control circuit board 201 is connected to a ground 301 within the image control circuit board 201, and the terminal 312 of the connector 205 in the semiconductor laser drive circuit board 202 is connected to a ground 302 within the semiconductor laser drive circuit board 202. Thus, the impedance of the conductor 350 connected between these terminals is sufficiently small. The terminal 307 of the connector 204 on the image control circuit board 201 is connected to the ground 301 within the image control circuit board 201 via the capacitor 321. The terminal 315 of the connector 205 in the semiconductor laser drive circuit board 202 is connected to the ground 302 within the semiconductor laser drive circuit board 202 via the capacitor 325. Thus, the conductor 353 has low impedance in terms of high frequency.

The image control circuit board 201 generates an enable signal and an image synchronization signal that are used for controlling the semiconductor laser.

The enable signal is input to an output buffer 328. The enable signal output from the output buffer 328 is input to a receiving buffer 338 via the terminal 330 of the connector 204, the conductor 358, and the terminal 334 of the connector 205. The image synchronization signal is input to an output buffer 329. The image synchronization signal output from the output buffer 329 is input to a receiving buffer 339 via the terminal 332 of the connector 204, the conductor 360, and the terminal 336 of the connector 205.

The terminals 311 and 331 of the connector 204 connected to ends of the conductors 357 and 359 adjacent to the conductor 358 are connected to the ground. The terminals 319 and 335 of the connector 205 connected to the other ends of the conductors 357 and 359 are connected to the ground.

The terminal 333 of the connector 204 connected to one end of the conductor 361 adjacent to the conductor 360 and the terminal 337 of the connector 205 connected to the other end are also connected to the respective grounds.

The semiconductor laser drive signal, the enable signal, the image synchronization signal that have been input from the image control circuit board 201 to the semiconductor laser drive circuit board 202 via the FFC 203 are input to a semiconductor laser drive integrated circuit (IC), which is not illustrated, via the receiving buffers 324, 338 and 339, respectively.

The configuration of the embodiment enables return signal paths to be appropriately provided for power supply lines and other control signals.

Furthermore, for example, if the FFC 203 is inserted into the connector 204 of the image control circuit board 201 at an angle, the terminal 308 of the connector 204 and the terminal 307 adjacent thereto may be shorted. However, since the terminal 307 is connected to the ground via the capacitor 321, its impedance is high in terms of direct-current. This can keep power supplied from the power supply line 322 from flowing to the terminal 307. Thus, a malfunction can be kept from occurring in the image control circuit board 201. The capacitor 325 is also connected to the terminal 315 connected to the terminal 307 via the conductor 353. This can keep power supplied from the power supply line 322 from flowing to the terminal 315 and thus keep a malfunction from occurring in the semiconductor laser drive circuit board 202.

In the embodiment, each terminal adjacent to a power supply terminal of connector to which an FFC is connected is connected, via one capacitor, to a ground within a printed-circuit board on which the connector is mounted. In the embodiment, a plurality of capacitors whose frequency responses are different may be included. The use of a plurality of capacitors can reduce impedance over a wide range of frequencies in comparison with the use of one capacitor.

Figure 4:
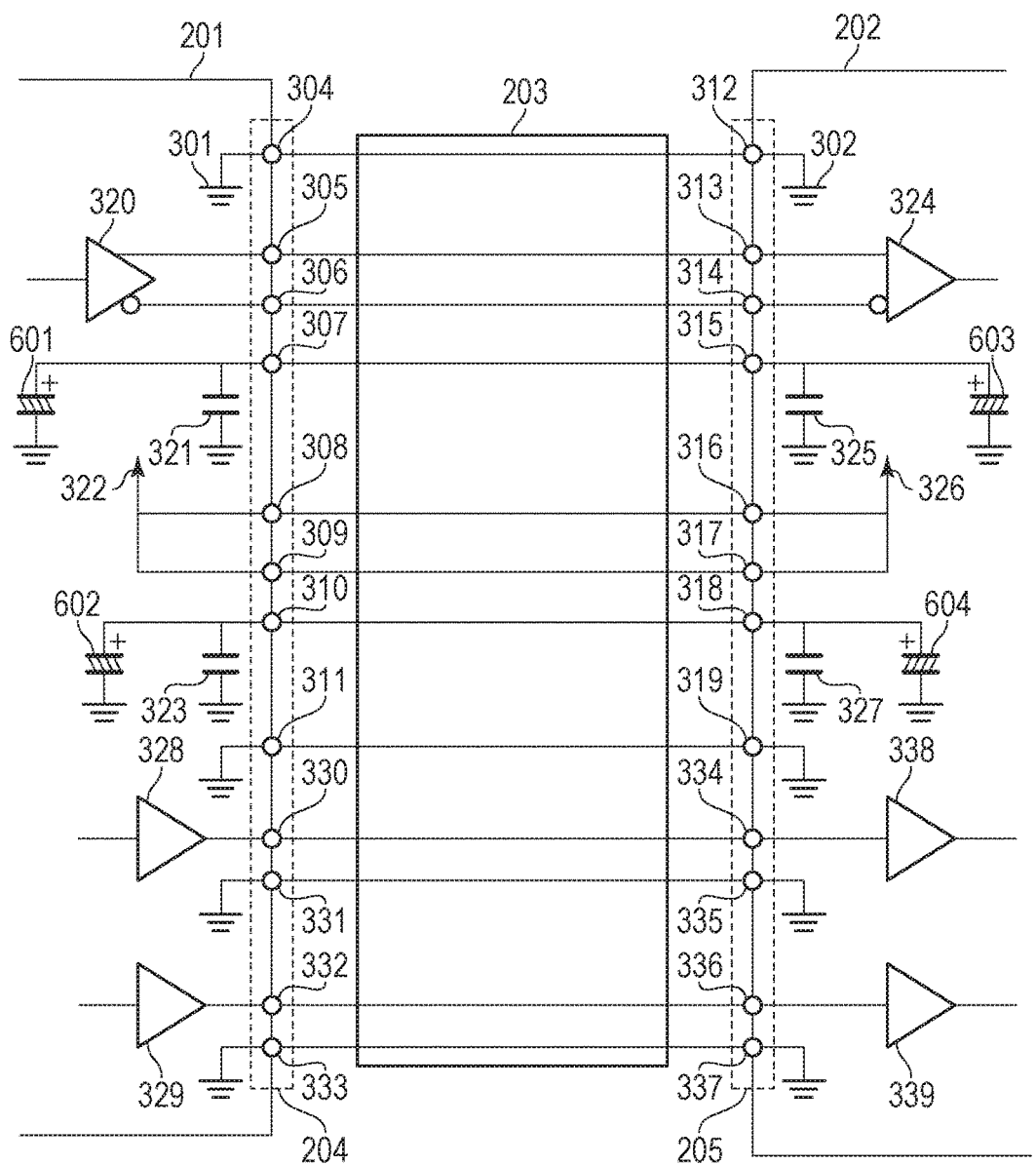
FIG. 4 illustrates pin configurations of the connectors in a modification.
Figure 5:
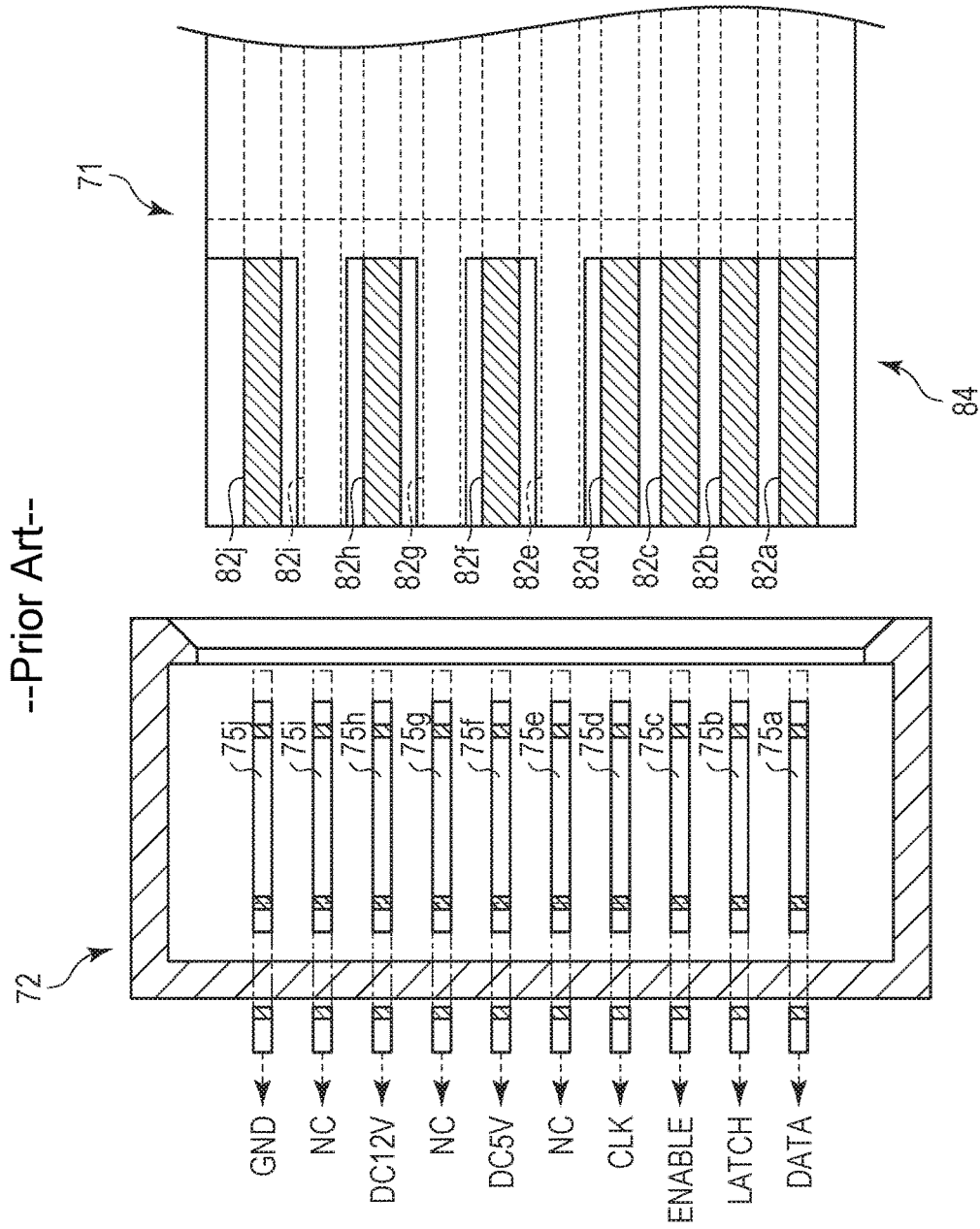
FIG. 5 illustrates a pin configuration of a connector in related, art.

FIG. 4 illustrates pin configurations of the connectors 204 and 205 according to a modification. Components that are the same as those in the above-described embodiment are denoted by the same reference numerals, and descriptions thereof are omitted.

In the modification, in the connector 204, a plurality of capacitors 321 and 601 whose frequency responses are different are connected to the terminal 307 adjacent to the terminal 308 connected to the power supply line 322. Similarly, a plurality of capacitors 323 and 602 whose frequency responses are different are connected to the terminal 310. Similarly, in the connector 205, a plurality of capacitors 325 and 603 whose frequency responses are different are connected to the terminal 315, and a plurality of capacitors 327 and 604 whose frequency responses are different are connected to the terminal 318.

The capacitors 321, 323, 325, and 327 are ceramic capacitors and are suitable for reducing impedance in a high-frequency range. The capacitors 601, 602, 603, and 604 are aluminum electrolytic capacitors and are suitable for reducing impedance in a low-frequency range. Note that this is merely an example and any other types of capacitors may be used.

In the examples illustrated in FIGS. 3 and 4, although two conductors are used for supplying power, only one conductor or any number of conductors other than two conductors may be used. A flexible printed cable may be used in place of an FFC.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-176857, filed Sep. 8, 2015, which is hereby incorporated by reference herein in its entirety.

What is claimed is:

1. An electronic apparatus comprising:
   a first printed-circuit board including a first connector having a first terminal, a second terminal, a third terminal and a fourth terminal;
   a second printed-circuit board including a second connector having a fifth terminal, a sixth terminal, a seventh terminal and an eighth terminal; and
   a cable having a plurality of conductors including a first conductor, a second conductor, a third conductor, and a fourth conductor, the cable being connected to the first connector and the second connector,
   wherein the first conductor is a line configured to transmit a signal and is connected to the first terminal of the first connector and the fifth terminal of the second connector,
   wherein the third conductor is a line configured to supply power and is connected to the third terminal of the first connector and the seventh terminal of the second connector,
   wherein the second conductor is a line configured to be connected to ground and is connected to the second terminal of the first connector and the sixth terminal of the second connector,
   wherein the fourth conductor is a line configured to be connected to ground and is connected to the fourth terminal of the first connector and the eighth terminal of the second connector,
   wherein, in the cable, the second conductor and the fourth conductor are disposed adjacent to a conductor configured to supply power,
   wherein, in the first printed-circuit board, the second terminal and the fourth terminal are each connected to ground via a plurality of capacitors whose frequency responses are different, and
   wherein, in the second printed-circuit board, the sixth terminal and the eighth terminal are each connected to ground via a plurality of capacitors whose frequency responses are different.

2. The electronic apparatus according to claim 1,
   wherein the cable includes a plurality of conductors including the third conductor to supply power, and
   wherein, in the cable, the plurality of conductors configured to supply power are disposed adjacent to each other, and the second conductor and the fourth conductor are disposed adjacent to the plurality of conductors configured to supply power in such a manner as to sandwich the plurality of conductors configured to supply power.

3. The electronic apparatus according to claim 1,
wherein the cable further has a fifth conductor configured to be connected to ground,
wherein the first connector further has a ninth terminal connected to the fifth conductor,
wherein the second connector further has a tenth terminal connected to the fifth conductor,
wherein, in the cable, the fifth conductor is disposed adjacent to the first conductor,
wherein, in the first printed-circuit, board, the ninth terminal is connected to ground without any capacitor, and
wherein, in the second printed-circuit board, the tenth terminal is connected to ground without any capacitor.

4. The electronic apparatus according to claim 1,
wherein the plurality of capacitors connected to each of the second terminal and the fourth terminal include a ceramic capacitor, and
wherein the plurality of capacitors connected to each of the sixth terminal and the eighth terminal include a ceramic capacitor.

5. The electronic apparatus according to claim 4,
wherein the plurality of capacitors connected to each of the second terminal and the fourth terminal include an aluminum electrolytic capacitor, and
wherein the plurality of capacitors connected to each of the sixth terminal and the eighth terminal include an aluminum electrolytic capacitor.

6. The electronic apparatus according to claim 1,
wherein, in the cable, a conductor-to-conductor pitch is less than 1.0 mm.

* * * * *